United States Patent
Huang et al.

(10) Patent No.: US 6,242,334 B1
(45) Date of Patent: Jun. 5, 2001

(54) MULTI-STEP SPACER FORMATION OF SEMICONDUCTOR DEVICES

(75) Inventors: Michael Wei-Che Huang, Hsin-Tien; Jui-Tsen Huang, Taipei; Ling Lu, Chung-Ho; Tri-Rung Yew, Hsin-Chu Hsien, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/274,597

(22) Filed: Mar. 23, 1999

(51) Int. Cl.[7] .............................................. H01L 21/3205
(52) U.S. Cl. ............................ 438/595; 438/305; 438/279
(58) Field of Search ................................. 438/301, 305, 438/302, 595, 596, 279, 303

(56) References Cited

U.S. PATENT DOCUMENTS

| 5,714,413 | * | 2/1998 | Brigh et al. | 438/301 |
| 5,882,973 | * | 3/1999 | Gardner et al. | 438/279 |
| 5,908,315 | * | 6/1999 | Gardner et al. | 438/305 |

* cited by examiner

*Primary Examiner*—David Nelms
*Assistant Examiner*—Dung A Le

(57) ABSTRACT

A method for forming a semiconductor with overetched spacer is disclosed. The method includes firstly providing a semiconductor substrate with a gate oxide layer formed thereon, and forming a polysilicon layer on the gate oxide layer. Next, a photoresist layer is formed on the polysilicon layer to define a gate area, followed by anisotropically etching the polysilicon layer and the gate oxide layer. A first dielectric layer is conformably formed, and a second dielectric layer is then formed thereon. After anisotropically etching the second dielectric layer to form a first sidewall spacer on the sidewall of the first dielectric layer, a third dielectric layer is further formed over the exposed first dielectric layer and the first sidewall spacer. Finally, the third dielectric layer and the first sidewall spacer are anisotropically etched so that a second sidewall spacer is formed on the sidewall of the first sidewall spacer, wherein top surface of the first and the second sidewall spacer is below top surface of the first dielectric layer around the gate area.

13 Claims, 3 Drawing Sheets

MULTI-STEP SPACER FORMATION OF SEMICONDUCTOR DEVICES

BACKGROUND OF THE INVENTION

1. Field of the Invention

The present invention relates to a method for forming a semiconductor device, and more particularly to a method for forming a logic device using multi-step sidewall spacer formation.

2. Description of the Prior Art

For logic devices of modern integrated circuits, the narrow line effect of the titanium-salicide technology becomes a bottleneck while the dimension of the devices has been rapidly decreasing. In order to overcome this problem, as shown in FIGS. 1A and 1B, an over etch process of the sidewall spacer 180A around the gate (160, 140, and 120) is usually applied, so that the top surface of the sidewall spacer 180A is over etched (about 500 angstroms) below the top surface of the gate. Unfortunately, the width of the sidewall spacer 180A is also accordingly reduced, resulting a sidewall spacer too narrow for the purpose of isolation.

In the prior art, in order to solve the aforementioned dilemma, a thicker spacer (e.g. 1500–2000 angstroms compared to conventional 1000 angstroms) is used, which results in a sidewall spacer with enough width for isolation. However, this solution is not feasible for fabricating devices with dimension below 0.18 micrometer due to lack of space between gates. Further, width of the lightly doped drain (LDD) increases accordingly, which causes high resistivity and low speed for the devices. Furthermore, this solution causes top gate polysilicon (TGP) corner loss owing to heavy Ar bombardment during long spacer etch.

For the foregoing reasons, there is a need for a method of forming a logic device in the integrated circuits whose sidewall spacer has enough width for isolation without aforementioned disadvantages.

SUMMARY OF THE INVENTION

In accordance with the present invention, a multi-step method is provided for forming a semiconductor device with overetched spacer that is feasible for the logic devices.

Another purpose of the present invention is to provide a method for forming logic devices in the integrated circuits, wherein the sidewall spacer has enough width for the purpose of isolation.

Furthermore, the present invention provides a method for forming logic devices feasible for fabricating semiconductor devices with dimension below 0.18 micrometer without scarifying the resistivity of the lightly-doped drain (LDD) structure or causing top gate polysilicon (TGP) corner loss owing to heavy Ar bombardment during spacer etch.

In one embodiment, a semiconductor substrate with a gate oxide layer formed on the substrate is firstly provided, followed by forming a polysilicon layer on the gate oxide layer. Next, a photoresist layer is formed on the polysilicon layer to define a gate area, and the polysilicon layer and the gate oxide layer are then anisotropically etched using the photoresist layer as a mask until surface of the substrate is exposed. After forming a tetraethoxysilane (TEOS) layer on the exposed substrate and on the etched polysilicon layer and gate oxide layer, and subsequently forming a first silicon nitride layer on the TEOS layer, the first silicon nitride dielectric layer is anisotropically etched until the TEOS layer is exposed, thereby forming a first sidewall spacer on the sidewall of the TEOS layer around the gate area. A second silicon nitride layer is formed over the exposed TEOS layer and the first sidewall spacer. Finally, the second silicon nitride layer and the first sidewall spacer are anisotropically etched so that a second sidewall spacer is formed on sidewall of the first sidewall spacer, wherein the top surface of the first and the second sidewall spacer is below the top surface of the TEOS layer around the gate area.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
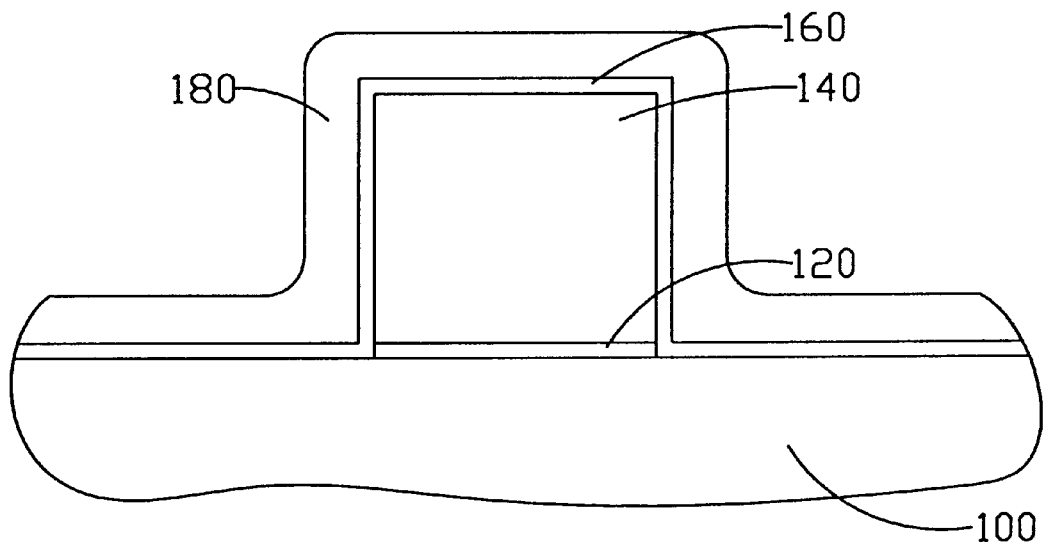
FIGS. 1A and 1B show simplified diagrams illustrative of a conventional method for forming a logic device with an overetched spacer.
Figure 1B:
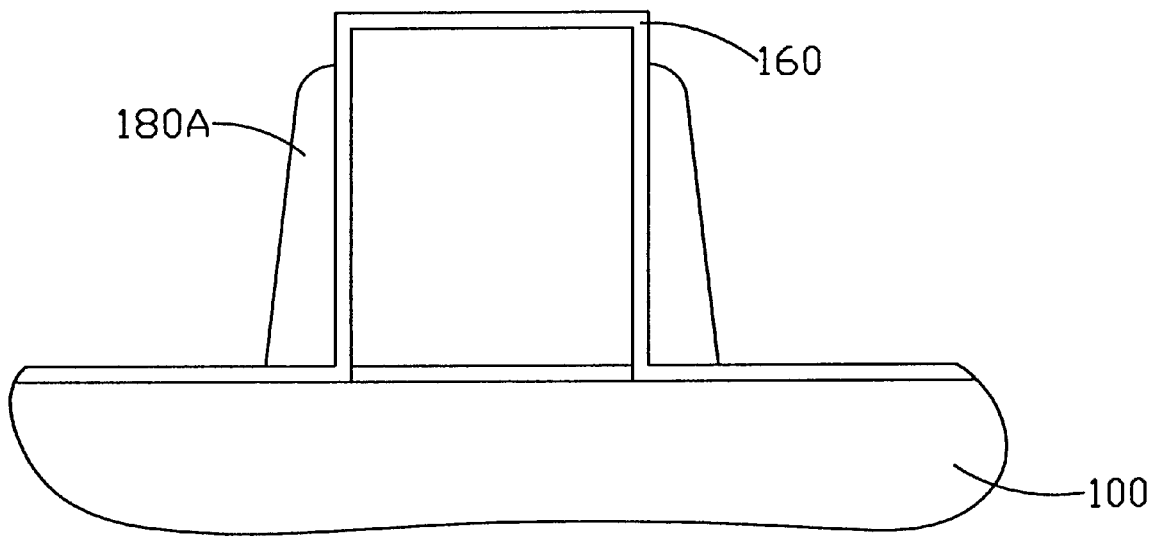
Figure 2:
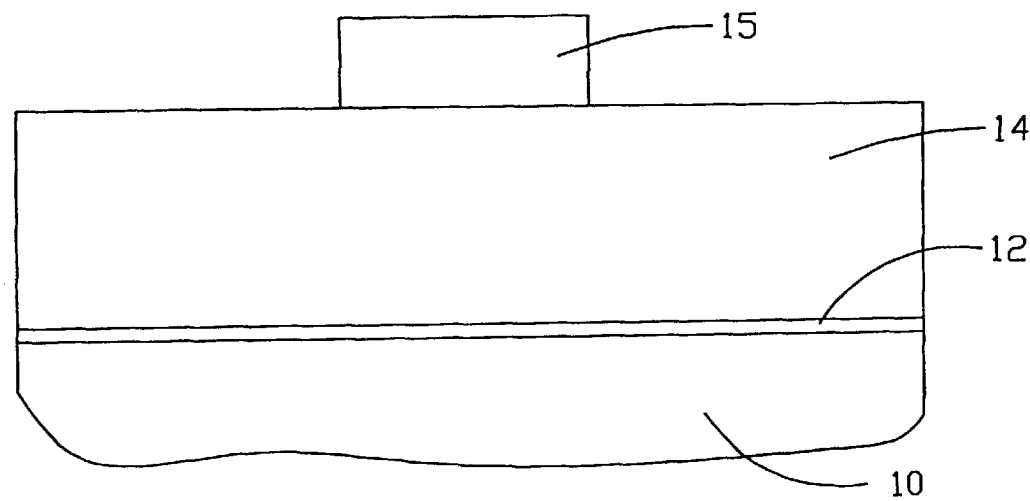
FIGS. 2 to 7 show cross-sectional views illustrative of various stages in the fabrication of a logic device in accordance with one preferred embodiment of the present invention.

Referring to FIG. 2, a silicon substrate 10 with p type conductivity is first provided. It is appreciated that a semiconductor substrate with n type conductivity can also be used. The substrate 10 is then subjected to an oxidation process, such as a dry oxidation technique, thereby growing a silicon oxide layer 12 on the substrate 10 up to about 100–250 angstroms in thickness. This silicon oxide layer 12 is used as a gate oxide layer subsequently. Next, a polysilicon layer 14 having thickness of about 2000–3000 angstroms is deposited on the gate oxide layer 12, followed by implanting As or P atoms inside the polysilicon layer 12 to reduce its resistivity. A photoresist layer 15 is then formed and patterned on the polysilicon layer 14 using standard photolithography techniques, defining a gate area over a portion of the polysilicon layer 14.

Figure 3:
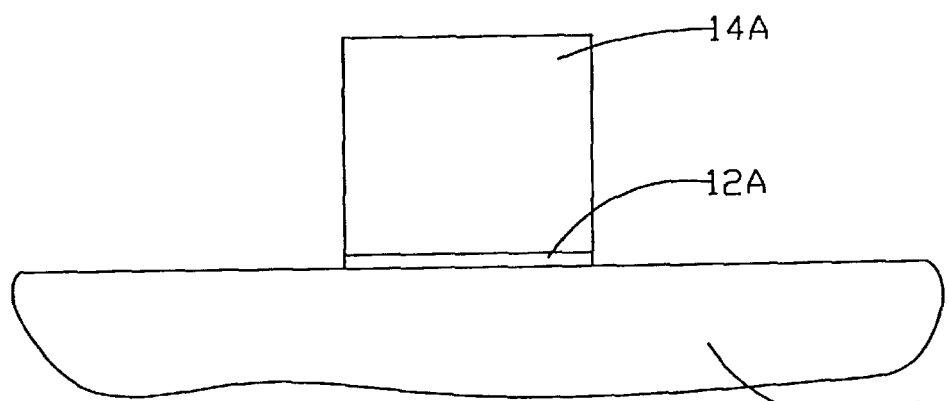

After portions of the polysilicon layer 14 and the gate oxide layer 12 are etched using the photoresist layer 15 as a photo mask, a gate structure consisting of the etched polysilicon layer 14A and the etched gate oxide layer 12A is thus formed as shown in FIG. 3. In this embodiment, the etch method performed in this step uses a conventional self-aligned reactive ion etch process.

Figure 4:
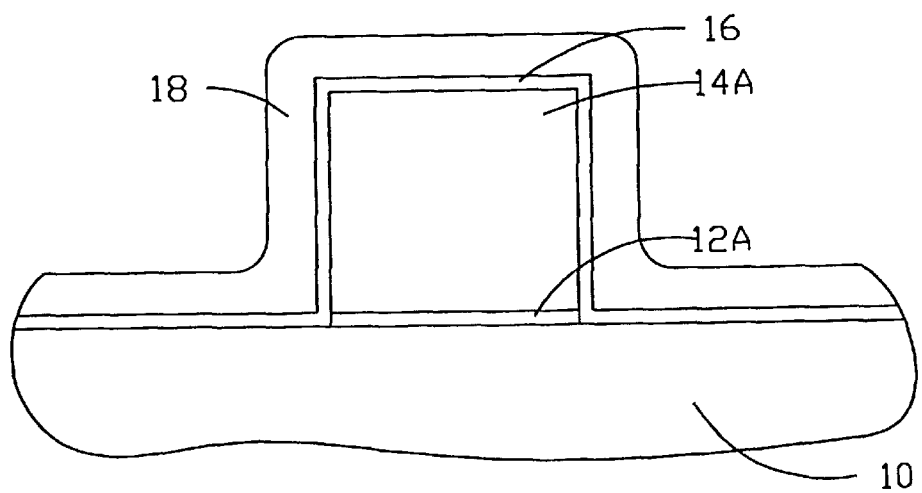

Referring to FIG. 4, a dielectric layer 16, such as tetraethoxysilane (TEOS) layer, having about 200 angstroms in thickness is conformably deposited on the gate 12A and 14A, and on the surface of the exposed substrate 10. In this embodiment, a low pressure chemical vapor deposition (LPCVD) is applied. Subsequently, another dielectric layer 18 is formed over the TEOS layer 16. The dielectric layer 18 has thickness of about 1000 angstroms, and is preferably composed of silicon nitride deposited by a conventional plasma enhanced chemical vapor deposition (PECVD).

Figure 5:
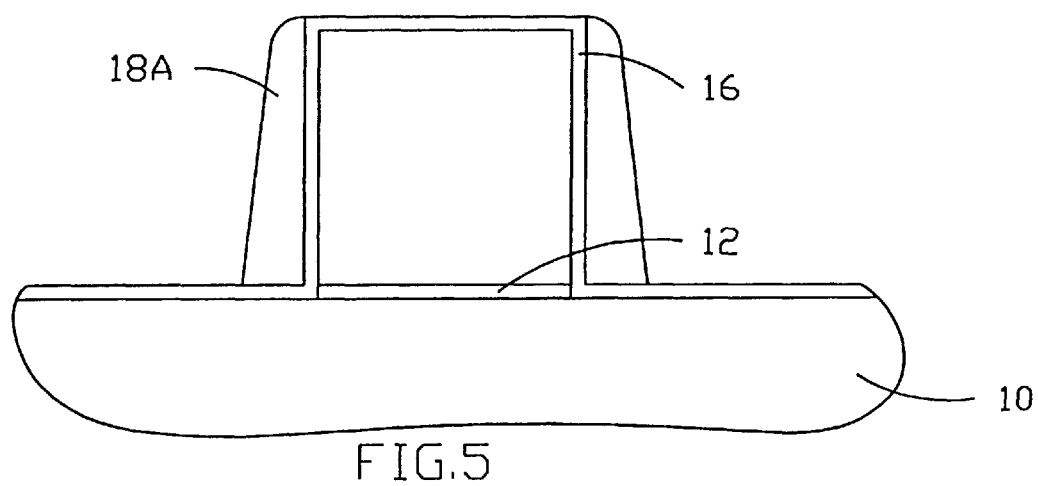

The silicon nitride layer 18 is then subjected to an anisotropic etch, such as a standard self-aligned reactive ion etch, thereby resulting in a sidewall spacer 18A as shown in FIG. 5. The preferred width of the sidewall spacer 18A abutting the surface of the TEOS layer 16 is about 600–700 angstroms.

Figure 6:
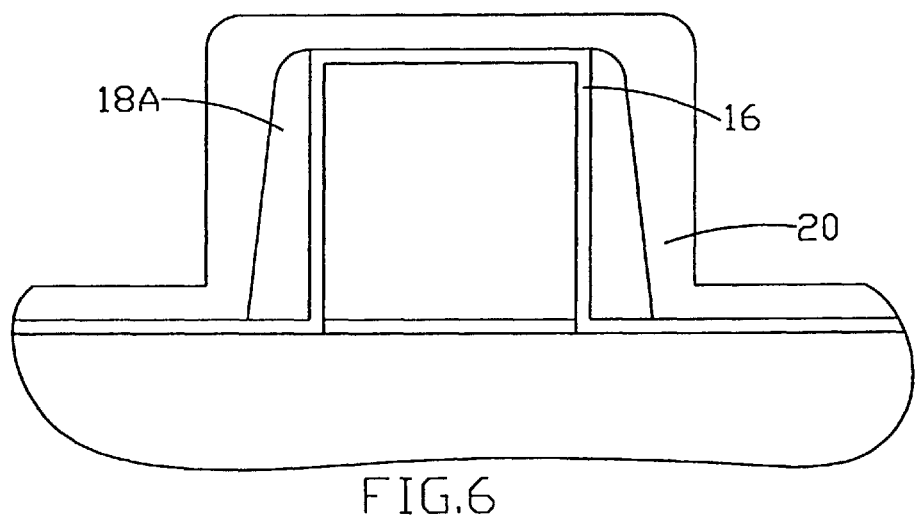

Referring to FIG. 6, a further dielectric layer 20 is formed over the TEOS layer 16 and the sidewall spacer 18A. The dielectric layer 20 has thickness of about 1000 angstroms, and is preferably composed of silicon nitride deposited by a conventional plasma enhanced chemical vapor deposition (PECVD).

Figure 7:
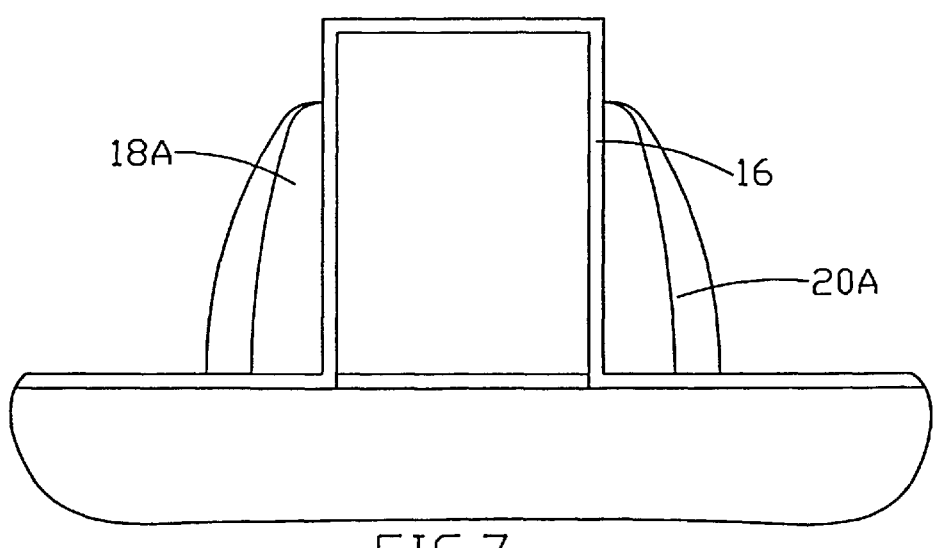

The structure of FIG. 6 is then subjected to an etch process, such as a standard self-aligned reactive ion etch, thereby resulting in a second sidewall spacer 20A on the sidewall of the previous sidewall spacer 18A. Further, these two sidewall spacers 18A and 20A are over etched, so that the top surface of these sidewall spacers 18A and 20A is preferably about 500 angstroms below the top surface of the TEOS layer 16 around the gate area as shown in FIG. 7. Accordingly to the present embodiment, the width of the second sidewall spacer 20A is about 200–300 angstroms. Therefore, the combined width of these two sidewall spacers 18A and 20A is about 800–1000 angstroms.

Accordingly, a semiconductor device with overetched spacer is formed for the logic devices, where the sidewall spacer has enough width for the purpose of isolation. Particularly, the present invention provides a method for forming logic devices feasible for fabricating semiconductor devices with dimension below 0.18 micrometer without scarifying the resistivity of the lightly-doped drain (LDD) structure or causing top gate polysilicon (TGP) corner loss owing to heavy Ar bombardment during spacer etch.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a semiconductor substrate with a gate oxide layer formed thereon;

forming a polysilicon layer on the gate oxide layer;

forming a photoresist layer on said polysilicon layer to define a gate area;

anisotropically etching said polysilicon layer and said gate oxide layer using said photoresist layer as a mask until surface of said substrate is exposed;

forming a conformal silicon oxide layer on the exposed substrate, the etched polysilicon layer and the gate oxide layer as a buffer layer;

forming a first dielectric layer different from said silicon oxide on said silicon oxide layer;

anisotropically etching said first dielectric layer until said silicon oxide layer is exposed, thereby forming a first sidewall spacer on sidewall of said silicon oxide layer around the gate area;

forming a second dielectric layer of the same material of said first dielectric layer over the exposed silicon oxide layer and said first sidewall spacer; and anisotropically overetching said second dielectric layer and said first sidewall spacer to etch said second dielectric layer laterally so that a second sidewall spacer is formed on sidewall of said first sidewall spacer, wherein top surface of said first sidewall spacer and said second sidewall spacer is below top surface of said silicon oxide layer around the gate area.

2. The method according to claim 1, wherein said silicon oxide layer is tretraethoxysilane (TEOS).

3. The method according to claim 1, wherein said first dielectric layer comprises silicon nitride.

4. The method according to claim 1, wherein said etched polysilicon layer acts as a gate of the semiconductor device.

5. A method for forming a spacer in semiconductor device, comprising:

providing a semiconductor substrate with a gate oxide layer formed thereon;

forming a polysilicon layer on the gate oxide layer;

forming a photoresist layer on said polysilicon layer to define a gate area;

anisotropically etching said polysilicon layer and said gate oxide layer using said photoresist layer as a mask until surface of said substrate is exposed;

conformally forming a tretraethoxysilane (TEOS) layer on the exposed substrate, the etched polysilicon layer and the gate oxide layer;

forming a first silicon nitride layer on said TEOS layer;

anisotropically etching said first silicon nitride layer until said TEOS layer is exposed, thereby forming a first sidewall spacer on sidewall of said TEOS layer around the gate area;

forming a second silicon nitride layer over the exposed TEOS layer and said first sidewall spacer; and anisotropically overetching said second silicon nitride layer and said first sidewall spacer to etch said second silicon nitride layer laterally so that a second sidewall spacer is formed on sidewall of said first sidewall spacer, wherein top surface of said first sidewall spacer and said second sidewall spacer is below top surface of said TEOS layer around the gate area.

6. The method according to claim 5, wherein said gate oxide layer is formed using a dry oxidation technique.

7. The method according to claim 5, further comprising P atoms or As atoms in said polysilicon layer.

8. The method according to claim 5, wherein said polysilicon layer is etched using a self-aligned reactive ion etch.

9. The method according to claim 5, wherein said TEOS layer is formed using a low pressure chemical vapor deposition.

10. The method according to claim 5, wherein said first sidewall spacer is formed using a self-aligned reactive ion etch.

11. The method according to claim 5, wherein said second sidewall spacer is formed using a self-aligned reactive ion etch.

12. The method according to claim 5, wherein distance between said top surface of said first sidewall spacer and the top surface of said TEOS layer is about 500 angstrom.

13. The method according to claim 5, wherein combined width of said first sidewall spacer and said second sidewall spacer is about 800–1000 angstroms.

* * * * *